United States Patent
Krivts et al.

(10) Patent No.: US 6,899,765 B2
(45) Date of Patent: May 31, 2005

(54) CHAMBER ELEMENTS DEFINING A MOVABLE INTERNAL CHAMBER

(75) Inventors: Igor Krivts, Rehovot (IL); Eyal Kotik, Ramat Gan (IL); Eitan Pinhasi, Beney Berak (IL); Hagay Cafri, New Ziona (IL)

(73) Assignee: Applied Materials Israel, Ltd., Rehovot (IL)

( * ) Notice: Subject to any disclaimer, the term of this patent is extended or adjusted under 35 U.S.C. 154(b) by 251 days.

(21) Appl. No.: 10/113,605

(22) Filed: Mar. 29, 2002

(65) Prior Publication Data

US 2003/0185715 A1 Oct. 2, 2003

(51) Int. Cl.[7] .......................... C23C 16/00; H01L 21/00; B65G 49/007
(52) U.S. Cl. ...................... 118/730; 118/719; 118/728; 118/729; 156/345.51; 156/345.54; 156/345.55; 156/345.31; 156/345.32; 414/939
(58) Field of Search ........................ 118/719, 728–730; 156/345.51, 345.54, 345.55, 345.31, 345.32; 414/935–939; 204/298.23, 298.25, 298.27

(56) References Cited

U.S. PATENT DOCUMENTS

| | | | | |
|---|---|---|---|---|
| 4,191,385 A | * | 3/1980 | Fox | 277/3 |
| 4,818,169 A | * | 4/1989 | Scram | 414/331 |
| 5,037,262 A | * | 8/1991 | Moll et al. | 414/222.04 |
| 5,314,574 A | * | 5/1994 | Takahashi | 438/706 |
| 5,730,801 A | * | 3/1998 | Tepman et al. | 118/719 |
| 5,898,179 A | * | 4/1999 | Smick et al. | 250/492.1 |
| 5,909,276 A | * | 6/1999 | Kinney et al. | 356/237.2 |
| 6,221,781 B1 | * | 4/2001 | Siefering et al. | 438/704 |
| 6,409,837 B1 | * | 6/2002 | Hillman | 118/712 |
| 6,455,098 B2 | * | 9/2002 | Tran et al. | 427/8 |

* cited by examiner

Primary Examiner—Gregory Mills
Assistant Examiner—Karla Moore
(74) Attorney, Agent, or Firm—McDermott, Will & Emery

(57) ABSTRACT

A process chamber for processing or inspecting a substrate such as a semiconductor wafer and the like includes a internal chamber employing dynamic seals at the interface of relatively moving elements. In one embodiment, the internal chamber has a first element, such as a lid or cover, and a second element, such as the body of the chamber. The first element and the second element meet at the interface. The internal chamber may further include a substrate support, mounted inside the internal chamber, supporting a substrate. A first movement system may produce at least one type of relative movement between the first element and the second element. A second movement system may produce second relative movement between the second element and the substrate support. The resulting structure allows movement of the chamber, while maintaining pressure inside the chamber.

27 Claims, 7 Drawing Sheets

CHAMBER ELEMENTS DEFINING A MOVABLE INTERNAL CHAMBER

BACKGROUND OF THE INVENTION

The present invention relates to semiconductor inspection systems and/or processing, and more particularly to chambers for processing or inspecting substrates such as semiconductor wafers, reticles, and the like for the manufacture of integrated circuits (ICs). Integrated circuits are manufactured by building semiconductor devices on one or more substrates in a process chamber. The semiconductor devices are interconnected to form the IC. A semiconductor wafer may have one, or many, or a few ICs.

Semiconductor devices are fabricated on substrates such as silicon wafers by processes that involve depositing, patterning, and removing of materials on the substrates. Deposition processes such as chemical vapor deposition (CVD) or physical vapor deposition (PVD) may be used to deposit a layer of material on a substrate. Photolithography techniques may be used to create a pattern on a layer of material to control where etching, depositing, or implanting will occur. Etch processes may be used to remove portions of a deposited layer, so that other materials may be deposited in the removed portions. Ion implantation processes may be used to change the properties of a deposited layer of material by physically bombarding and implanting dopants into the deposited layer. By using various ones of these process steps, semiconductor devices, and, thus, integrated circuits are created on the substrate.

In fabricating ICs, specialized process chambers are used sequentially to perform the steps required to build the semiconductor devices and the ICs. Each chamber usually has an internal chamber in which predefined conditions, such as a certain vacuum level, are maintained during the process. For a complex integrated circuit, hundreds of individual process steps may be involved in building and interconnecting all of the underlying semiconductor devices. To streamline the manufacturing process, process chambers may be integrated into a cluster tool, so that the different process steps may be executed sequentially and efficiently, using less factory space than stand-alone chambers, and requiring less distance to transport wafers from process step to process step. A cluster tool provides process sequence integration by "clustering" several different process chambers into one platform.

In some inspection tools and process chambers a substrate is moved along various directions during the inspection/ or manufacturing process respectively. The inspection tool/ process chamber has an internal chamber in which various predefined conditions (such as a certain vacuum level) are maintained. When some processing chambers are integrated into a cluster tool the substrate may be shifted from one process chamber to another without the need to break pressure seals in the process environment. As a result, there may be fewer opportunities for unwanted contamination to occur. In addition, it is possible to save some or all of the time involved in completely venting up an internal chamber, moving a substrate from stand-alone chamber to stand-alone chamber, and then pumping down each succeeding internal chamber to achieve the necessary level of vacuum to conduct the next process sequence.

Because of the complexity of the manufacturing process, there is frequent inspection of substrates to ensure that the process steps are executed properly and that the substrates are reasonably free of defects, preferably as free of defects as is practicable. Currently, processing and inspection of semiconductor substrates are done separately, in stand-alone tool.

Accordingly, there is a need to provide an efficient method and system for allowing to integrate an inspection tool into a cluster tool. An inspection chamber that can be integrated into a cluster tool would further streamline the manufacturing process for integrated circuits.

There is a further need to provide a chamber with an internal chamber that may be pumped rapidly. There is yet a further need to allow efficient and relatively contamination free system and method for moving a substrate while maintaining predefined conditions within an internal chamber in which the substrate is placed.

SUMMARY OF THE INVENTION

The present invention provides a movable internal chamber that is defined by chamber elements whereas at least some of the chamber elements can move in relation to other chamber elements while maintaining predefined conditions within the internal chamber.

According to an aspect of the invention the internal chamber is relatively small thus allowing a fast generation of the predefined conditions after the internal chamber is opened and closed.

According to an aspect of the invention the internal chamber is opened by means of introducing a relative movement between some chamber elements.

According to an aspect of the invention the movement of a substrate is followed by a movement of some of the chamber elements while maintaining the predefined conditions within the internal chamber.

According to an aspect of the invention the internal chamber is isolated from other components of the chamber, thus reducing internal chamber contamination.

According to another aspect of the invention at least some of the chamber structures employ one or more dynamic seals to establish one or more seals between relatively moving chamber structures. The seals can preserve pressure levels within the internal chamber.

According to an aspect of the invention the internal chamber is defined by a static upper plate, an outer floating ring, an inner floating ring, a flexible connector and a first portion of a movement system, such as an output shaft. A first dynamic seal is formed between a surface of the static upper plate and an upper surface of outer floating ring. The flexible connector is pivotally connected to the outer floating ring and inner floating ring, thus maintaining a desired pressure level, including various degrees of vacuum within the internal chamber. A second dynamic seal is formed between the output shaft to another end of the inner floating ring. The output shaft introduces motion to the substrate that is located within the internal chamber.

As discussed above, the movement system is mounted outside of the internal chamber. This feature decreases the potential for contamination of the interior of the chamber. This contamination potential exists because various contaminants, for example, different kinds of polymers, may be formed in the chamber by a process of carbonization when hydrocarbon molecules from grease, adhesive, or insulation of wires or connectors are dissociated during either processing or inspection of a substrate inside the chamber.

The connector feature, enabling tilt while operating at a maintained pressure within the chamber (such as a given level of vacuum), is desirable not only in the inspection of semiconductor devices at various stages of manufacture, as in the particular embodiment depicted in the drawings, but also in the process of manufacturing these semiconductor devices.

According to an aspect of the invention, a movement system for moving the substrate within the internal chamber is mounted outside of the internal chamber. This feature decreases the potential for contamination of the interior of the chamber. This contamination potential exists because various contaminants, for example, different kinds of polymers, may be formed in the chamber by a process of carbonization when hydrocarbon molecules from grease, adhesive, or insulation of wires or connectors are dissociated during either processing or inspection of a substrate inside the chamber.

According to another aspect of the invention the ability of the flexible connector to pivot may be used to compensate for any non-perpendicularity of the output shaft, thus allowing to tilt the substrate while maintaining predefined consitions within the internal chamber. Furthermore, the manufacturing criteria of the outer floating ring and the inner floating ring may be simplified because the flexible connector permits greater geometric and dimensional tolerance between the chamber components.

In one embodiment, one or more of the dynamic seals described herein may be similar to an air bearing vacuum seal disclosed in commonly assigned U.S. Pat. No. 6,163,033, entitled "Method and Apparatus for Controlling a Workpiece in a Vacuum Chamber." This U.S. patent is incorporated by reference herein.

In one embodiment, one or more dynamic seals may be achieved by using one or more gas bearings. Air pressure differentials may be maintained across the bearing interfaces such that ambient atmospheric pressure (or higher) may be present on one side of the interfaces while lower pressures, including various levels of vacuum, may be maintained on the opposite side of the interfaces. The air pressure differentials may be maintained without leakage of gas across the bearing interfaces in either direction. The dynamic seals described herein provide low-contact or even contactless interfaces between relatively moving elements, with a film of gas flowing between the elements, in some cases physically separating the elements. The gas film provides a force that opposes the weight of the relatively moving elements as well as any other forces that tend to cause mechanical or frictional resistance at the interfaces between the relatively moving elements. As a result, the gas bearings yield low friction, and in some cases, virtually frictionless interfaces between elements that are in relative movement with respect to one another.

In one embodiment, the internal chamber is defined by a first element having a first surface, and a second element having a second surface about the periphery of the internal chamber. The first surface and the second surface are positioned in proximity with each other to form an interface. The internal chamber further comprises a substrate support, mounted inside the internal chamber, to enable mounting of a substrate, and a first moving system producing relative movement between the first and second elements. The internal chamber employs one or more dynamic seals to allow the two elements to move relative to one another, while maintaining a desired pressure level, including various levels of vacuum, inside the internal chamber.

BRIEF DESCRIPTION OF THE DRAWINGS

The foregoing and other features of the invention will be understood better by reference to a detailed description of some embodiments in conjunction with the accompanying drawings, in which.

DETAILED DESCRIPTION OF THE EMBODIMENTS

Figure 1A:
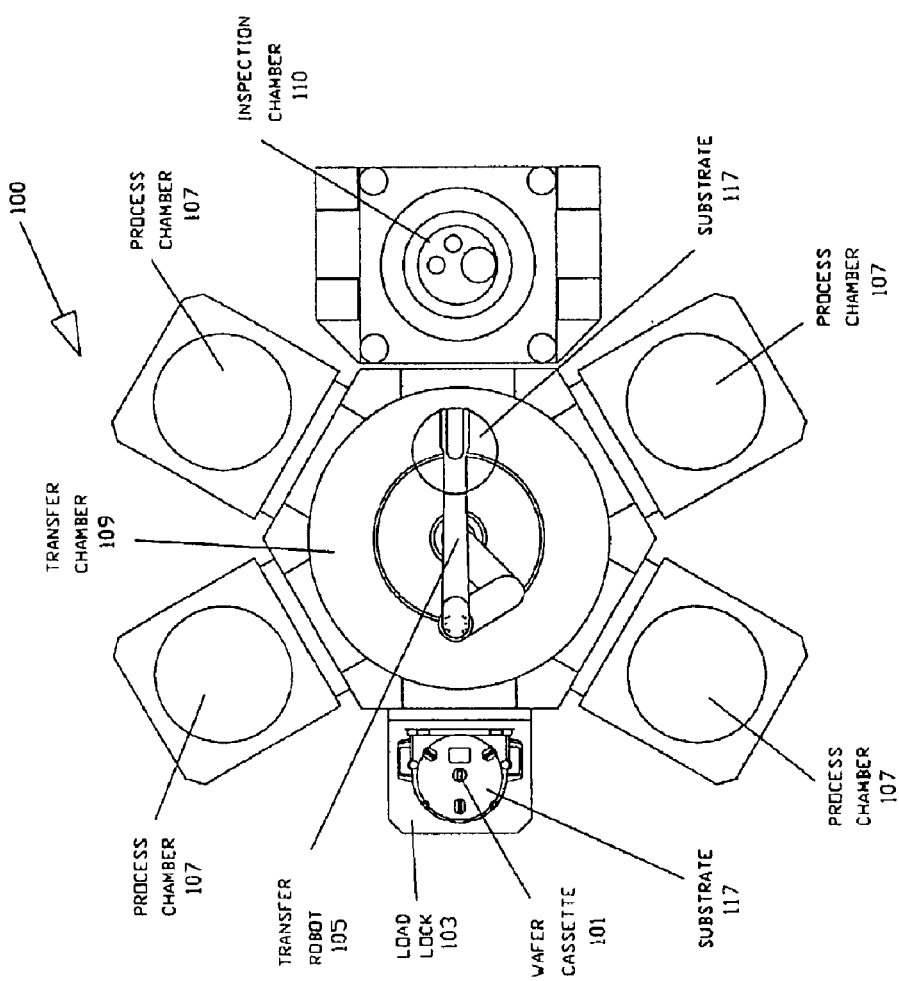
FIG. 1a shows a top view of one embodiment of a cluster tool, which includes a load lock, a transfer chamber, process chambers, and an inspection chamber, in which the present invention may be implemented.

Referring to FIG. 1a, in cluster tool 100, substrates 117 are transported in a wafer cassette 101. The wafer cassette 101 is loaded into a load lock 103, which then is sealed from outside pressure. One or more vacuum pumps (not shown) connected to the load lock 103 pump down the load lock 103 to a desired pressure level that may approximate the pressure level in transfer chamber 109. Transfer robot 105 picks up a substrate 117 from the wafer cassette 101 and loads the substrate 117 into any of the process chambers 107 in the cluster tool 100. Depending on the process chamber 107 into which the substrate 117 is inserted, material may be deposited on, or patterned on, or removed from the substrate 117.

Illustrated in FIG. 1a, an inspection chamber 110 having an internal chamber (not shown) is integrated into a cluster tool 100. Inspection chamber 110 includes a scanning electron microscope (SEM) 207 (FIG. 2) and an optical microscope 211 (FIG. 2) that may be positioned such as to inspect substrates the are located within the internal chamber. As discussed above, once the load lock doors are closed, the cluster tool 100 including the load lock 103, the transfer chamber 109, the process chambers 107, and the inspection chamber 110 may be sealed from the ambient environment. The substrate 117 may be transferred from the load lock 103 to any process chamber 107, and from one process chamber 107 to another process chamber 107 under a controlled pressure level, including various levels of vacuum. The pressure levels within the load lock 103, the transfer chamber 109, each of the process chambers 107 and the inspection chamber 110 may be maintained at substantially the same or different pressure levels, as desired, depending on the needs of the particular process in a given chamber 107.

Figure 1B:
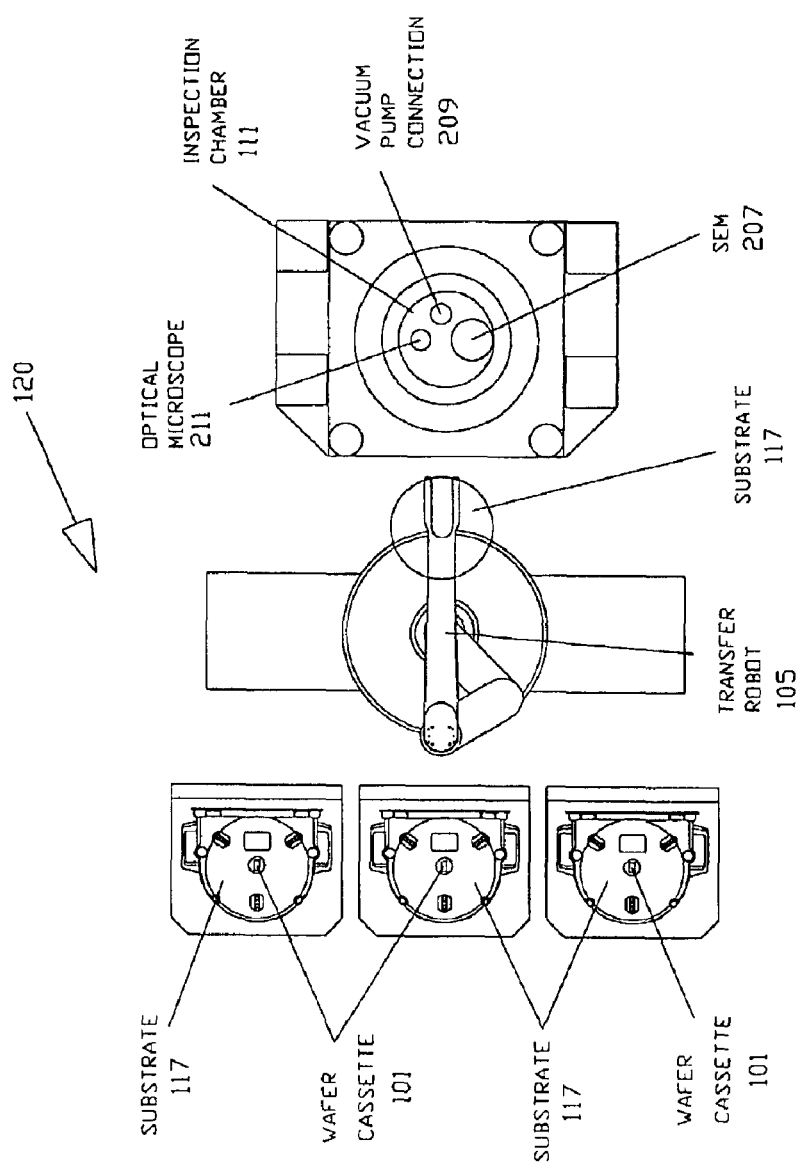
FIG. 1b shows a top view of one embodiment of a stand-alone tool, which includes a inspection chamber, wafer cassettes, and a transfer robot, in which the present invention may be implemented.

FIG. 1b illustrates a stand—alone inspection chamber 111 having an internal chamber (not shown). Inspection chamber 111 includes a SEM 207 (FIG. 2) and optical microscope 211 (FIG. 2), both may be mounted on the inspection chamber 120 such as to inspect substrates 117 located within the internal chamber. Transfer robot 105 picks up a substrate 117 from the wafer cassette 101 and loads the substrate 117 into the inspection chamber 120.

Figure 2:
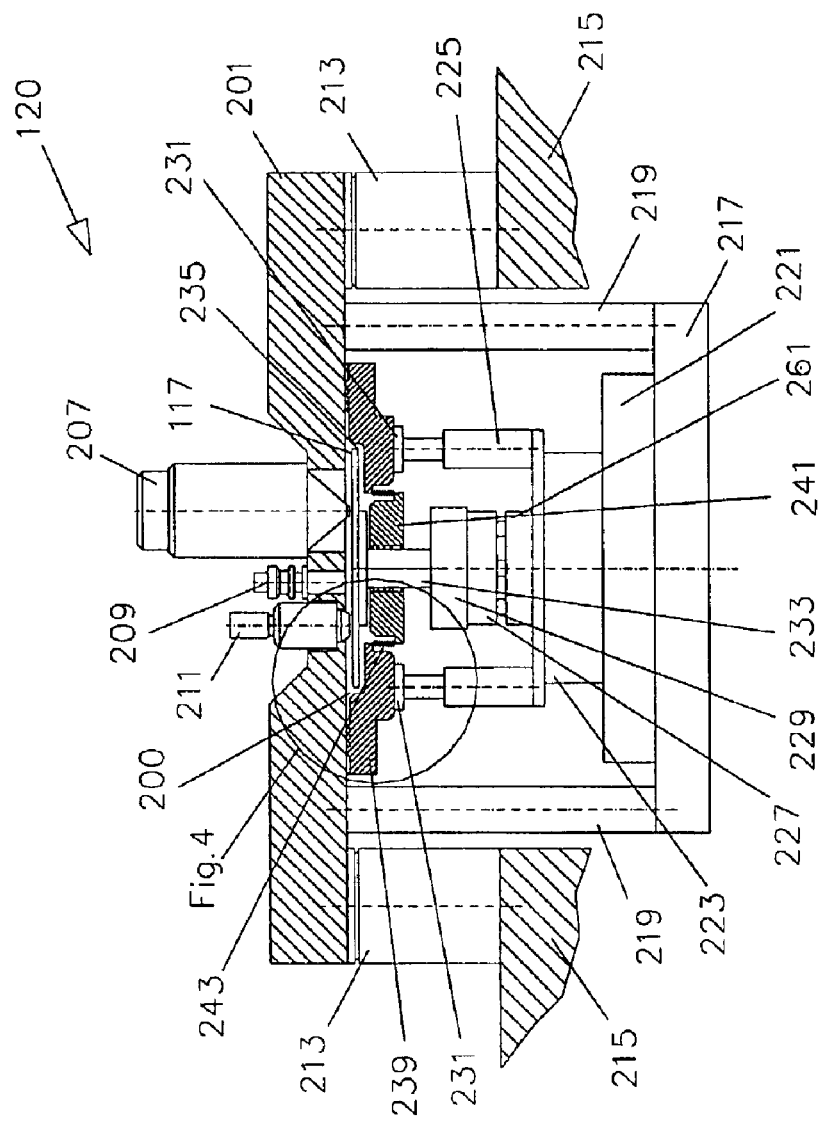
FIG. 2 shows a cross-sectional view of a internal chamber, in a closed position, according to one embodiment of the present invention.

FIG. 2 illustrates one embodiment of an inspection chamber 120 having an internal chamber 200. The inspection chamber 120 may be integrated into a cluster tool 100 (such as inspection chamber 110 of FIG. 1a) or may be in stand-alone configuration (such as inspection chamber 111 of FIG. 1b).

In one embodiment, inspection chamber 120 may be utilized for electron beam inspection or other type of charged particle beam inspection and/or milling. Accordingly such a chamber shall include electron beam imaging units, such as Scanning Electron Microscope, Focused Ion Beam generators and the like. In another embodiment, the internal chamber may be located within a process chamber, such as ion implant process chamber, etch process chamber, and the like.

Referring again to FIG. 2, the internal chamber may be defined by chamber elements that include dynamic seals. However, as will be appreciated from the following discussion, the dynamic seals help to maintain whatever pressure level is desired within the internal chamber, while the internal chamber is being moved, for example, horizontally in a first direction and a second direction that is perpendicular to the first direction.

According to an aspect of the invention the internal chamber 200 is defined by static upper plate 201, outer floating ring 239 inner floating ring 241, flexible connector 243 and an output shaft 233. A dynamic seal is formed between a surface of the static upper plate 201 and an upper surface of outer floating ring 239. The flexible connector 243 is pivotally connected to the outer floating ring 239 and inner floating ring 241, thus maintaining a desired pressure level, including various degrees of vacuum within the internal chamber 200. A dynamic seal is formed between the output shaft 233 to another end of the inner floating ring 239. The 233 output shaft is connected to an electrostatic chuck 235 such as to move the electrostatic chuck and accordingly to move a substrate that is supported by the electrostatic chuck 235.

The pivotable connection of the flexible connector 243 to the outer floating ring 239 and the inner floating ring 241 may be achieved by welding the ends of the flexible connector 243 to the outer and inner floating rings 239 and 241, respectively. The pivotable connection also may be achieved by securing the ends of the flexible connector 243 to the outer floating ring 239 and the inner floating ring 241 by clamps, screws, or bolts.

Figure 4:
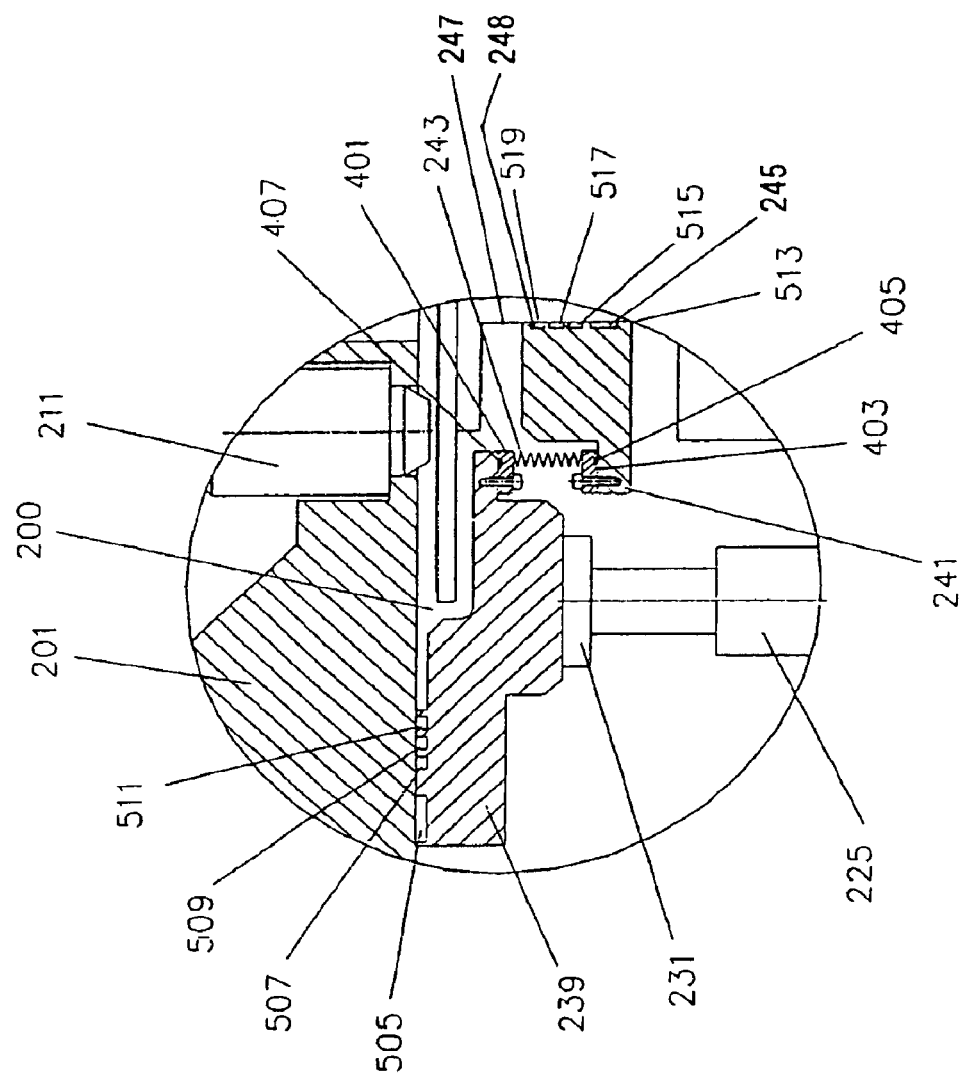
FIG. 4 shows a close-up of a cross-sectional view of the chamber illustrating the interfaces that employ dynamic seals between the relatively moving elements according to one embodiment of the present invention.

In one embodiment, as shown in FIG. 4, an upper flange 401 and a lower flange 403 are secured to the outer floating ring 239 and inner floating ring 241, respectively. The upper flange 401 and lower flange 403 are secured by any suitable method that permits easy installation and removal. Examples of such a method include, but are not to screws or bolts. The flange contact interfaces with the outer floating ring 239 and inner floating ring 241 may be made air-tight by contact seals such as metallic or elastomeric seals. In one embodiment, these seals may be O-ring seals 405 and 407. The ends of the flexible connector 243 are respectively welded to the upper flange 401 and the lower flange 403, such that the welded assembly may be easily installed or removed as a unit. As can be appreciated, once secured, the flexible connector 243 may pivot about its longitudinal axis, meaning that it can enable the outer floating ring 239 to tilt, or the inner floating ring 241 to tilt.

The flexible connector 243 may be a bellows and may be constructed from a variety of materials, including but not limited to stainless steel (such as Types 316, 316L, 321, and 347), phosphor bronze, brass or Monel. Other materials or alloys with similar relevant properties also may be used for the flexible connector 243; such materials or alloys are well known to the ordinarily skilled artisan. In addition, the connector flexible 243 may have any shape that allows it to pivot, expand, and/or contract. The material used to construct the flexible connector 243 may be selected based on its property to resist fatigue caused by repeated pivoting, expansion, and contraction. The flexible connector 243, such as a bellows, may be a commonly available commercial product, which may be readily obtained from a parts manufacturer, such as NiCoForm, Inc., Mat-Vac Technology, Inc., Servometer Corporation, or another.

In one embodiment, at the interface 206 between the first and second elements, the first surface 203 and the second surface 205 are curved. Either or both of the first surface 203 and the second surface 205 may be substantially planar or curved. In general, at the interface 206, the first surface 203 and the second surface 205 may have respective contours as necessary to enable formation of a suitable dynamic seal between those surfaces. Alternatively, the first surface 203 and the second surface 205 may be treated by coating or hardening to increase smoothness, prevent scratches and the like.

The electrostatic chuck 235 may be installed in the internal chamber 200. The chuck 235 supports a substrate 117, such as a semiconductor wafer. The electrostatic chuck 235 may be coupled to an electrical power supply (not shown) that provides the necessary power to operate the chuck 235. A chuck controller (not shown) controls the electrical power supply. The chuck controller may be a separate element, or may be part of a system controller (not shown). When in operation, the chuck 235 provides an electrostatic clamping force to hold the substrate 237 in place during processing or inspection operations.

The outer floating ring 239, flexible connector 243, and inner floating ring 241 may be made relatively small so that the assembled chamber has a relatively small volume. Having a small volume, the internal chamber 200 may be pumped down in a relatively short time, and a low pressure, including various degrees of vacuum, may be easily maintained.

The upper plate 201 is mounted on a base 215 by a vibro-isolation system 213. The vibro-isolation system 213 substantially dampens any vibration transmitted from the base 215 to the upper plate 201. A lower plate 217 is attached to the upper plate 201 via a system of substantially rigid bars 219. The lower plate 217 may be a granite table or any support structure that provides substantial stability and inertia to further prevent movement of the structure comprising the upper plate 201, the system of substantially rigid bars 219, and the lower plate 217.

In one embodiment, the lower plate 217 provides a substantially stable platform to support a first movement stage 221 that provides movement in a first direction and a second movement stage 223 that provides movement in a second direction that is perpendicular to the first direction. As can be seen in FIG. 2, the first movement stage 221 and the second movement stage 223 are mounted on the lower plate 217.

Looking again at FIG. 2, in one embodiment a tilt movement stage 261 also may be mounted over the combination of the first movement stage 221 and the second movement stage 223. The tilt movement stage 261 provides angular tilt movement about a central axis of the chamber, or about some other suitable axis. A vertical movement stage 227, providing vertical movement, also may be mounted over the tilt movement stage 261. A rotational movement stage 229 may be mounted over the vertical movement stage 227, to provide rotational movement in polar coordinates about the central axis of the chamber, or any suitable axis.

While FIG. 2 shows the first movement stage 221, the second movement stage 223, the tilt movement stage 261, the vertical movement stage 227, and the rotational movement stage 229 all within the same embodiment, it should be understood that the number of these stages, or their order of mounting, is not critical, and may be varied as desired, depending on the object to be accomplished.

In one embodiment a first end of an output shaft 233 is mounted to an output of the rotational movement stage 229. A second end of the output shaft 233 is connected to the electrostatic chuck 235 through the inner floating ring 241. As seen more readily in FIG. 4, inner surface 245 of the inner floating ring 241 and surface 247 of the output shaft 233 form an interface 248. In one embodiment, the surfaces 245 and 247 may be treated to enhance smoothness of the surfaces. In another embodiment the surfaces 245 and 247 may be hardened to prevent scratches. In a different embodiment, the first end of the output shaft 233 may be mounted to an output of the vertical movement stage 227. In a further embodiment, the first end of the output shaft 233 may be mounted to an output of the tilt movement stage 261. The movement stage to which the output shaft 233 is connected is not critical.

Figure 3:
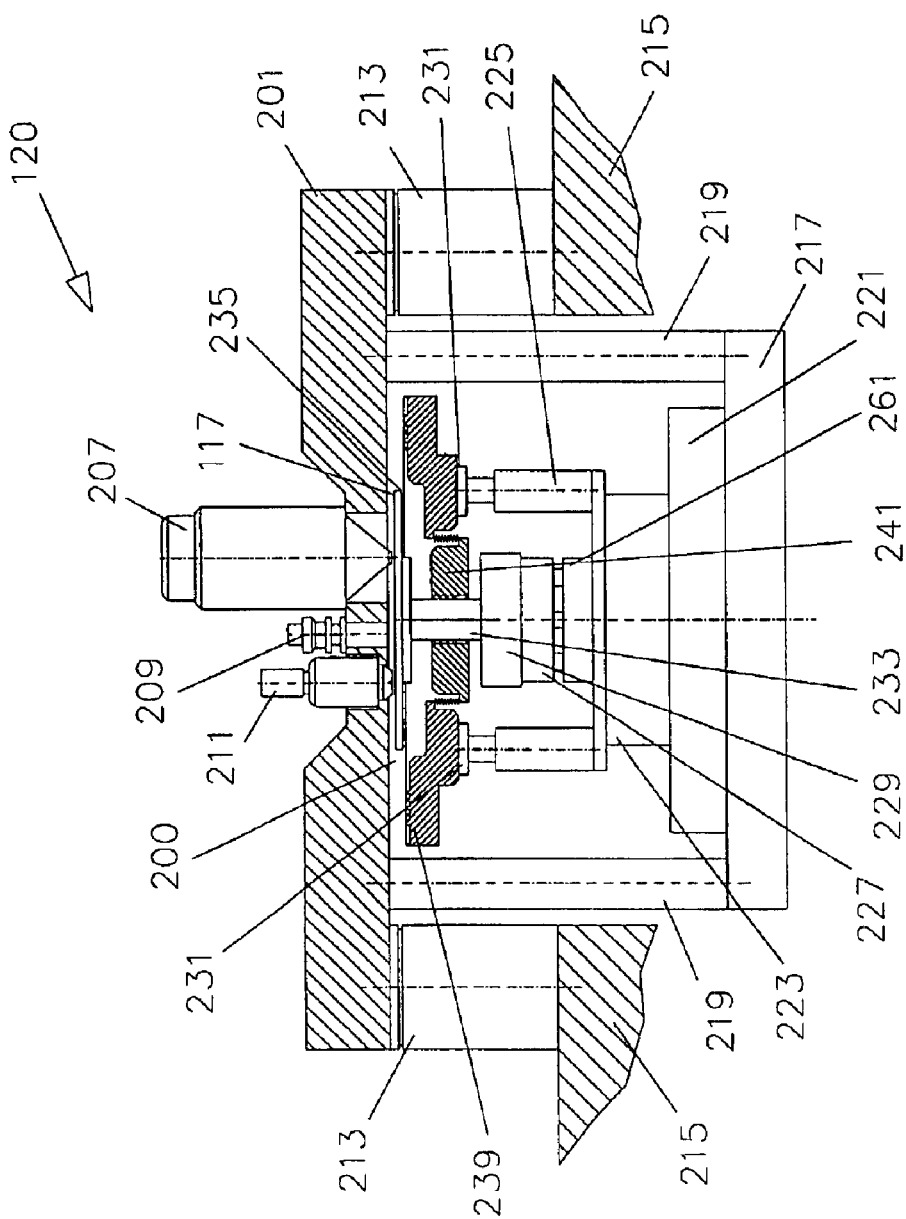
FIG. 3 shows a cross-sectional view of the internal chamber, in an open position, according to one embodiment of the present invention.

As shown in FIG. 2 and FIG. 3, an internal chamber opening mechanism 225 is installed over the combination of the first movement stage 221 and the second movement stage 223. To load or unload the substrate 117, the internal chamber opening mechanism 225 lowers the outer floating ring 239 to open a gap between the interface of the upper plate 201 and outer floating ring 239 (FIG. 3). To close the internal chamber 200 after the substrate 117 is loaded or unloaded, the internal chamber opening mechanism 225 raises the outer floating ring 239 and closes the gap between the interface of the upper plate 201 and the outer floating ring 239 (FIG. 2). In one embodiment, the internal chamber opening mechanism 225 is composed of three actuators (for example, pneumatic cylinders) and three kinematic couplings 231, which have three gimbaled mountings (not shown) that allow for substantial tolerance between mating parts. In one embodiment, the ends of each actuator (not shown) may be threaded ball studs (not shown), which facilitate alignment of the actuators. The described kinematic coupling arrangement provides a sealed actuation system with no requirement for adjustment. Finally, the chamber opening mechanism 225 may be operated by a separate control unit, or may be operated by the above-mentioned system controller.

As discussed above, the movement system is mounted outside of the internal chamber. This feature decreases the potential for contamination of the interior of the chamber. This contamination potential exists because various contaminants, for example, different kinds of polymers, may be formed in the chamber by a process of carbonization when hydrocarbon molecules from grease, adhesive, or insulation of wires or connectors are dissociated during either processing or inspection of a substrate inside the chamber.

As described, then, FIGS. 2 and 3 show an internal chamber 200 employing dynamic seals to provide a low friction, and in some cases a virtually frictionless interface between moving elements. The dynamic seals are employed to maintain a pressure level, including various degrees of vacuum, in the internal chamber 200, while the electrostatic chuck 235 is moved by the various movement stages. The internal chamber 200 tracks the horizontal and angular tilt movements of the electrostatic chuck 235.

The chamber structures including the outer floating ring 239, the flexible connector 243 and the inner floating ring 241 are assembled primarily to maintain a pressure level, including various degrees of vacuum. The chamber structures track the movements of the electrostatic chuck 235 as the output shaft 233 moves the chuck in various movements, such as horizontal and angular tilt movements. Therefore, the chamber structures are not used to move the electrostatic chuck 235. Accordingly, the chamber structures do not necessarily need to be made of rigid materials.

Looking at FIG. 4, the outer floating ring 239 employs a dynamic seal system including an air bearing annular groove 505 and an isolating land (adjacent to the groove) to provide a relatively contactless seal between the upper plate 201 and the outer floating ring 239 with a film of gas. One or more gas pumps (not shown) provide compressed gas to the air bearing annular groove 505 via one or more gas supply conduits (not shown). In one embodiment, the gas supply conduits may be an array of gas nozzles and flow restrictors similar to the gas supply system disclosed in the commonly assigned U.S. Pat. No. 6,163,033. The one or more gas pumps may be operated separately, or under control of the above-mentioned system controller. The bottom surface of the upper plate 201 may be smooth, and in one embodiment, the bottom surface is planar to enhance the low-friction characteristic of the interface.

Figure 5:
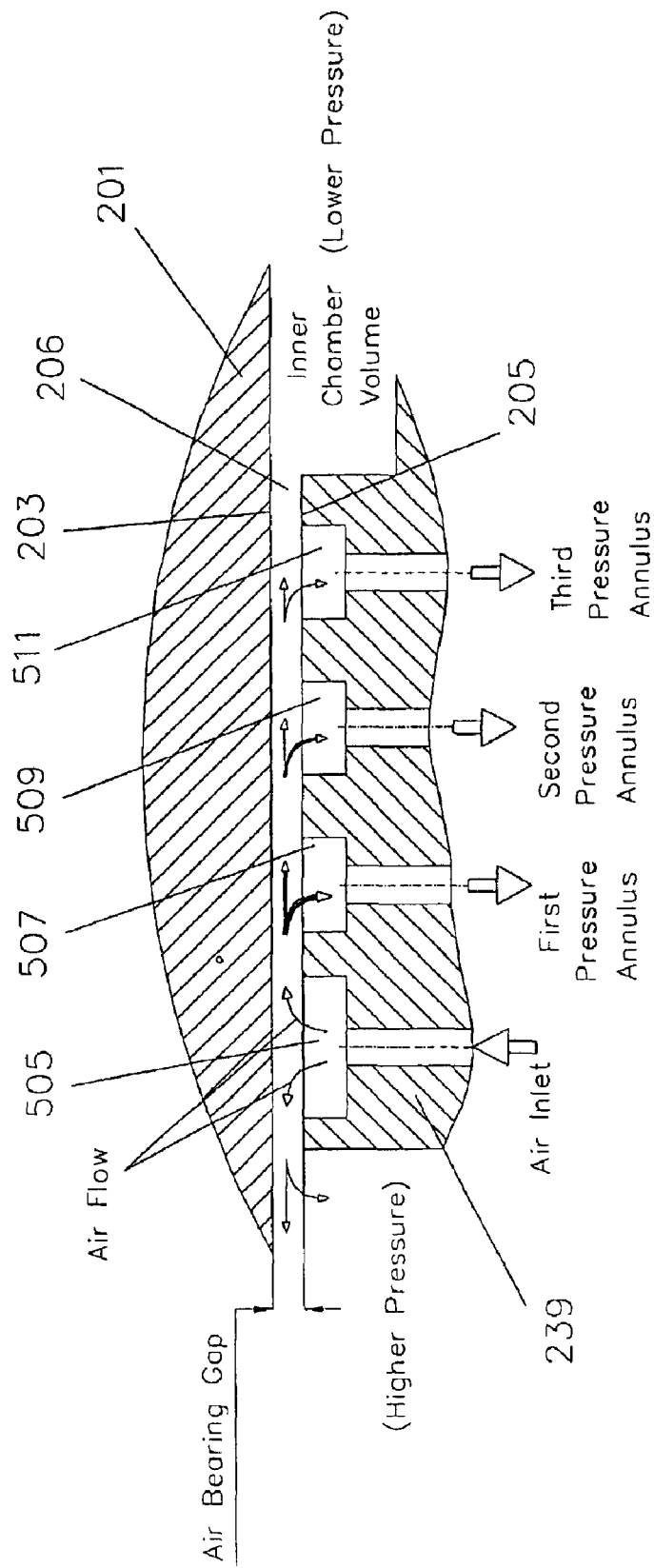
FIG. 5 shows an inboard sweeper plenum according to one embodiment of the present invention.

FIG. 5 shows one embodiment of an inboard sweeper plenum as applied to the dynamic seals according to the present invention. In one implementation, the outer floating ring 239 has an air bearing annular groove 505, a first pressure (in one embodiment, atmospheric pressure) annular groove 507, a second pressure (in one embodiment, relatively low vacuum) annular groove 509, and a third pressure (in one embodiment, relatively high vacuum) annular groove 511. These elements provide an integral dynamic seal.

In one embodiment, the grooves are arranged so that they provide seals for increasing levels of vacuum going from outside the chamber to inside the chamber, so that the chamber in this embodiment is at a relatively high vacuum. However, it will be appreciated by those skilled in the art that the arrangement of the grooves, and their order, will depend on the application, the relative pressure differential inside and outside the chamber, and the like. It also will be appreciated that the number of grooves is not critical, but may be varied as desired.

Each plenum, annular grooves 507, 509, and 511, and its isolating land act to remove residual gas from the air bearing annular groove 505 until the required level of isolation is achieved at the seal interface. One or more exhaust conduits (not shown), which may be similar to the exhaust ports in the gas exhaust system disclosed in the commonly assigned U.S. Pat. No. 6,163,033, are coupled to each plenum to remove the residual gas. The conduits are connected to one or more vacuum pumps (not shown). The vacuum pumps may be operated separately, or under the control of the system controller. The necessary number of plenum stages depends upon the level of vacuum required and the pumping rate of the vacuum pumps in conjunction with the precision of the air bearing gap.

In another implementation, the groove structure 505–511 is provided on the upper plate 201, rather than on the outer floating ring 239. As discussed above, each plenum, vacuum annular grooves 507, 509, and 511, and its isolating land act to remove residual gas from the air bearing annular groove 505 until the required level of isolation is achieved at the seal interface. The presence of the groove and land structure on the outer floating ring 239, as opposed to the upper plate 201, is not important; it is the achievement of the seal that is important.

Referring back to FIG. 4, in one embodiment of the present invention, the inner floating ring 241 has an air bearing annular groove 513, a first pressure (in one embodiment, atmospheric pressure) annular groove 515, a second pressure (in one embodiment, relatively low vacuum) annular groove 517, and a third pressure (in one embodiment, relatively high vacuum) annular groove 519, to provide an integral dynamic seal between the inner floating ring 241 and the output shaft 233. The purpose, arrangement, and number of the grooves 513–519 is similar to those provided in the foregoing discussion of the groove and land structure 505–511, and the considerations going into the ultimate configuration of grooves 513–519 likewise is similar.

One or more gas pumps (not shown) provide compressed gas to the air bearing annular groove 513 via one of more gas supply conduits (not shown). In one embodiment, the gas supply conduits may be an array of gas nozzles and flow restrictors similar to the gas supply system disclosed in the commonly assigned U.S. Pat. No. 6,163,033. The description of the gas supply system in that U.S. Patent is incorporated by reference herein. The gas pumps may be operated separately, or under control of the system controller.

Each plenum, annular grooves 515, 517, and 519, and its isolating land act to remove residual gas from the air bearing annular groove 513 until the required level of isolation is achieved at the seal interface. The residual gas is removed by way of one or more exhaust conduits (not shown), which may be similar to the exhaust ports in the exhaust system disclosed in the commonly assigned U.S. Pat. No. 6,163,033, coupled to each plenum. The description of the exhaust ports in that U.S. Patent is incorporated by reference herein. The exhaust conduits are connected to one or more vacuum pumps (not shown). The vacuum pumps may be operated separately, or under the control of the system controller. The necessary number of such plenum stages depends upon the level of vacuum required and the pumping rate of the vacuum environment in conjunction with the precision of the air bearing gap.

As illustrated in FIGS. 2, 3, 4, and 6, the flexible connector 243 connects the outer floating ring 239 to the inner floating ring 241. The flexible connector 243 extends generally along an axis defined by the centerline of the output shaft 233, the central axis of the chamber, or any suitable axis. The flexible connector 243 may pivot, expand or contract along this axis. The flexible connector 243 is capable of maintaining vacuum or other suitable pressure levels within the internal chamber 200. The ability of the flexible connector 243 to pivot may be used to compensate for any non-perpendicularity of the output shaft 233, as provided by the tilt movement stage 261, with respect to the bottom surface of the upper plate 201. Additionally, the manufacturing criteria of the outer floating ring 239 and the inner floating ring 241 may be simplified because the flexible connector 243 permits greater geometric and dimensional tolerance between the chamber components. Geometric tolerance includes controlling perpendicularity and parallelism between surfaces. For example, because the outer and inner floating rings, 239 and 241 are connected by the flexible connector 243, the surfaces of the rings 239 and 241 do not necessarily need to be manufactured precisely parallel to the surfaces of the upper plate 201 and the output shaft 233 to achieve proper interfaces.

Figure 6:
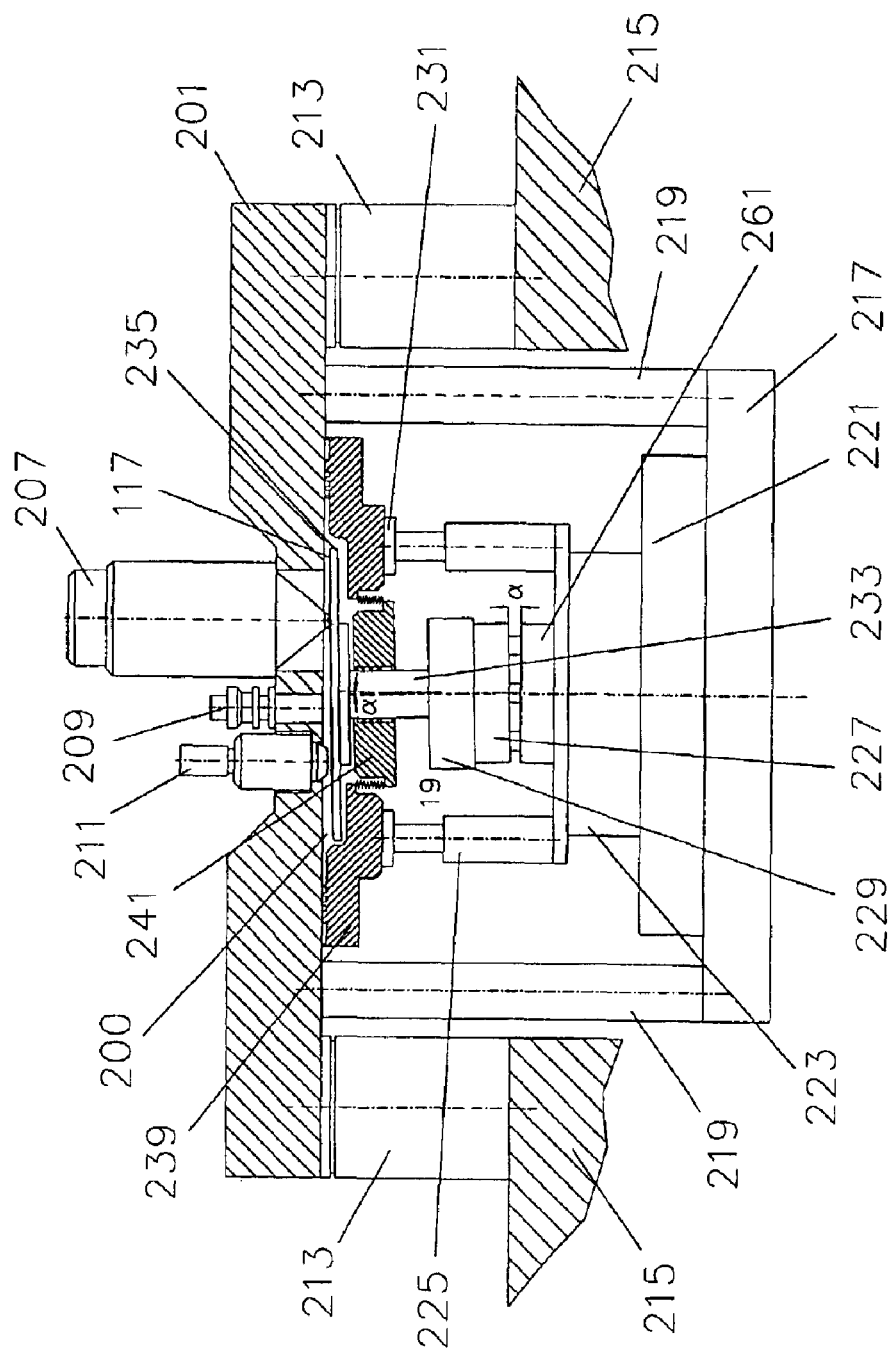
FIG. 6 shows another cross-sectional view of the internal chamber according to one embodiment of the present invention.

FIG. 6 illustrates the output shaft 233 being tilted by the tilt movement stage 261 at an angle α from the central axis of the output shaft 233. The output shaft 233 may be also tilted about any suitable axis, such as the central axis of the outer floating ring 239, the inner floating ring 241, or the chamber assembly. The internal chamber 200 remains sealed and maintains a desired pressure level by means of the dynamic seals as the electrostatic chuck 235 and the substrate 117 are moved, rotated, and/or tilted by the various movement stages.

The connector feature, enabling tilt while operating at a maintained pressure within the chamber (such as a given level of vacuum), is desirable not only in the inspection of semiconductor devices at various stages of manufacture, as in the particular embodiment depicted in the drawings, but also in the process of manufacturing these semiconductor devices.

Ion implantation is one example of a semiconductor manufacturing process in which tilting of the wafer in the ion implantation internal chamber may be useful. Typically, the surface of the wafer will be oriented generally to be perpendicular to the axis of the shortest beamline used, so that the ion beam strikes in a direction that is normal to the planar surface of the substrate. However, in certain implantation processes or steps, it is desirable, or even necessary for the ion beam to strike the substrate at an orientation that is some angle from normal. The internal chamber according to the present invention, with the tilt movement stage 261 and the pivotably mounted flexible connector 243, permits tilting and/or pivoting of the substrate about the axis of the beam path, the central axis of the internal chamber, or any suitable axis.

Another advantage of the internal chamber employing dynamic seals is the ability to achieve greater positional accuracy. Conventional movement systems employing frictional bearings are prone to positional errors caused by velocity spikes, wheel or gear creepage, spring preload, and the like. However, because the present invention employs dynamic seals and the moving elements have little or no actual physical contact at the interface, positional errors are reduced. Therefore, the internal chamber according to the present invention provides greater flexibility and efficiency for many semiconductor manufacturing processes.

As will be understood by those of skill in the art, the present invention may be embodied in other specific forms or configurations without departing from the essential characteristics thereof. Accordingly, the foregoing description is intended to be illustrative, but not limiting, of the scope of the invention which is set forth in the following claims.

What is claimed is:

1. Chamber elements defining an internal chamber to be utilized during a stage selected from the group consisting of semiconductor manufacturing stage and semiconductor inspection stage, the chamber elements comprising:

a first element having a first surface;

a second element having a second surface about the periphery of said internal chamber, wherein said first surface and said second surface come into proximity with each other at a first interface; and a first dynamic seal at said first interface; wherein the chamber elements are operable to partially surround a first portion of a movement system, the movement system generates first relative movement between said first element and said second element, said first dynamic seal maintaining predefined conditions in the internal chamber during the relative movement.

2. The chamber element according to claim 1 operable to surround a substrate during a processing stage of the substrate.

3. The chamber elements according to claim 1 operable to surround a substrate during an inspection of the substrate.

4. The chamber elements according to claim 1 wherein the movement system comprises a first portion partially positioned within the internal chamber.

5. The chamber elements according to claim 4 wherein a second dynamic seal is formed between the second element and the first portion of the movement system; said second dynamic seal and first dynamic seal maintaining predefined conditions in the internal chamber during the relative movement.

6. The chamber elements according to claim 4 wherein the first portion of the movement system is connected to a substrate support.

7. The chamber elements according to claim 1 wherein the first element comprises: an upper plate; a base; and a vibro-isolation system, having a first end mounted to the base and a second end mounted to the upper plate, supporting the upper plate and isolating the upper plate from vibration.

8. The chamber elements of claim 1 wherein the first element further comprises: a lower plate; and a plurality of substantially rigid bars, each of said bars having a first end mounted to the upper plate and a second end mounted to the lower plate, so as to suspend said lower plate under said upper plate.

9. The chamber elements according to claim 1, wherein the first movement system comprises at least one movement stage selected from the group consisting of: a first movement stage, generating movement in a first direction; a second movement stage, generating movement in a second direction, perpendicular to said first direction; and a third movement stage, generating rotational movement.

10. The chamber elements according to claim 9, wherein the first movement system comprises the third movement stage, and wherein the rotational movement is about a central axis of said internal chamber.

11. The chamber elements according to any one of claims 1 to 10, wherein the second element comprises: an outer floating ring; an inner floating ring; and a flexible structure connecting the outer floating ring and the inner floating ring to form said internal chamber.

12. The chamber elements according to claim 11, wherein said flexible structure is pivotable so that said outer floating ring and said inner floating ring pivot with respect to each other.

13. The chamber elements according to claim 11, wherein said flexible structure is expandable and contractible.

14. The chamber elements according to claim 11, wherein said connector comprises a bellows.

15. The chamber elements according to claim 11, wherein the movement system comprises a tilt movement stage generating angular tilt movement.

16. The chamber elements of claim 11, further comprising a chamber opening mechanism, mounted over the first movement system and connected to the outer floating ring, wherein said chamber opening mechanism lowers and raises said second element.

17. An inspection tool comprising: inspection units for inspecting a substrate positioned within an internal chamber; a first element having a first surface; a second element having a second surface about the periphery of said internal chamber, wherein said first surface and said second surface come into proximity with each other at a first interface; a first dynamic seal at said first interface; and a movement system generating first relative movement between said first element and said second element, said first dynamic seal maintaining predefined conditions in the internal chamber during the relative movement.

18. In the fabrication of integrated circuits, a method of providing a internal chamber usable for processing or inspecting one or more substrates in a cluster tool, said method comprising: providing a first element having a first surface; providing a second element having an internal chamber to contain said substrate, said second element having a second surface, wherein said second surface and said first surface form a first interface; and providing a first dynamic seal at said first interface to enable first relative movement between said first element and said second element while maintaining a desired level of pressure within said internal chamber.

19. A method according to claim 18, wherein said first dynamic seal maintains a vacuum seal during said first relative movement.

20. A method according to claim 18, wherein said first relative movement comprises movement along respective perpendicular axes which lie in a plane that is perpendicular to a central axis of said internal chamber.

21. A method according to claim 18, wherein said relative movement comprises rotational movement in polar coordinates.

22. A method according to claim 18, further comprising isolating vibrations from being transmitted to the first element by using a vibro-isolating system.

23. A method according to claim 22, wherein the first element is substantially stationary relative to said second element.

24. A method according to claim 22, wherein said second element comprises an inner floating ring and an outer floating ring, said method further comprising providing a second dynamic seal for maintaining pressure during second relative movement between said inner floating ring and a substrate support holding a substrate in said internal chamber.

25. A method as claimed in claim 24, wherein said second relative movement comprises one or more of vertical movement, angular tilt movement, and rotational movement.

26. A method according to claim 25, wherein the angular tilt movement is about a central axis of said second element and the rotational movement is about said central axis.

27. A method according to claim 24, wherein said second dynamic seal provides a vacuum seal between moving elements generated by the second relative movement.

* * * * *